United States Patent [19]

Menniti et al.

[11] Patent Number: 4,775,912
[45] Date of Patent: Oct. 4, 1988

[54] PROTECTION DEVICE AGAINST THE DRIVING EFFECT OF PARASITIC TRANSISTORS IN MONOLITHIC INTEGRATED CIRCUITS

[75] Inventors: Pietro Menniti, Milan; Angelo Alzati, Bollate, both of Italy

[73] Assignee: SGS Microlelettronic S.p.A., Catania, Italy

[21] Appl. No.: 916,216

[22] Filed: Oct. 7, 1986

[30] Foreign Application Priority Data

Nov. 27, 1985 [IT] Italy ................................ 23012 A/85

[51] Int. Cl.$^4$ ............................................. H02H 3/20
[52] U.S. Cl. ........................................ 361/56; 361/91; 357/23.13; 357/48
[58] Field of Search .................. 361/58, 77, 91, 88, 361/18, 23, 31, 33; 357/48, 86, 23.13, 23.1, 51; 307/246, 254; 363/15, 20, 21, 50, 56

[56] References Cited

U.S. PATENT DOCUMENTS 4,496,849 1/1985 Kotowski ..................... 357/48 X
4,558,286 12/1985 Neidorff ........................ 357/48

FOREIGN PATENT DOCUMENTS 910976 11/1962 United Kingdom .

Primary Examiner—A. D. Pellinen
Assistant Examiner—Todd E. DeBoer
Attorney, Agent, or Firm—Bierman & Muserlian

[57] ABSTRACT

Described is a protection device for power PNP transistors against the anomalous driving effect of parasitic transistors which are excited, under certain limit conditions, in bipolar type monolithic integrated circuits. The device is of simple integration and requires essentially the use of a PNP protection transistor connected with its emitter and collector respectively to the emitter or to a node at a higher potential than the latter and to the base of the PNP transistor to be protected and physically made on the chip in a position essentially adjacent to the PNP transistor to be protected.

5 Claims, 2 Drawing Sheets

PROTECTION DEVICE AGAINST THE DRIVING EFFECT OF PARASITIC TRANSISTORS IN MONOLITHIC INTEGRATED CIRCUITS

The present invention relates to a protection device for PNP power transistors against the driving effect of parasitic transistors in bipolar type monolithic integrated circuits.

As it is well known to the expert technician, in monolithic integrated circuits of bipolar technology there exist peculiar problems of "interaction" among active devices physically adjacent in the layout of the circuit which are evidenced upon the taking place of extreme working conditions, for example, the saturation of one or more transistors caused by eccessive excursions of the load impedance or other anomalous conditions in the operation of the circuit.

The "interaction" shows up with the creation, that is with the excitation, of a "parasitic transistor" through the junctions of the real transistor with the accompanying anomalous driving of the devices, in particular adjacent PNP transistors, which may bring about destructive breakdowns too.

Naturally this problem is of particular concern in the case of integrated power transistors of output stages of the integrated circuit, both for the relatively high levels of the currents as well as for the increased probability that such transistors be accidentally driven to saturation for example upon variation of the load impedance of the transistor, external to the integrated circuit.

However, there exists a whole series of circuit situations, also different from that of output power stages, wherein the above mentioned problem manifests itself.

For example, such a problem is of particular concern in circuits which drive inductive or capacitive loads and which therefore are subject to the so-called problems of "below ground".

The main objective of the present invention is to provide a protection device for effectively counteracting the effects of the creation of a parasitic transistor upon the occurrence of particular conditions of operation of the integrated circuit.

This objective and other advantages are obtained by means of the protection device object of the present invention which results particularly effective in protecting a typical integrated composite structure PNP+NPN from being unduly driven by a parasitic NPN transistor connected between the base and the emitter of the composite structure PNP+NPN, respectively, with its collector and its emitter.

The protection device of the invention is implemented by inserting, in an appropriate position in the layout of the integrated circuit, a PNP transistor having its collector connected to the base node of the PNP transistor (or of the composite structure PNP+NPN) to be protected, its emitter may be connected to the same node of the emitter of the PNP transistor to be protected or to a node at a higher voltage than the voltage of the emitter's node of the PNP transistor to be protected while the base of the protection transistor may be left disconnected; though more preferably it is suitably connected to a network for the control of the $\beta$ of the transistor.

Such a control network for the $\beta$ of the transistor has, in the first place, an anti-leakage function, that is that of reducing the probability that the protection transistor be unduly brought into conduction by non-pertinent "events", moreover, the adoption of such a control network allows a precise adjustment of the $\beta$ (in the design stage) in order to provide for a more effective intervention of the protection transistor.

The control network may be composed of a diode and/or of a resistor connected between the base and the emitter of the protection transistor.

In accordance with the objective of the invention, the parasitic transistor, because of its relative position and dimensions with respect to the various regions or "pockets" in the layout of the integrated circuits, whenever it is accidentally turned on, interacts both with the PNP transistor (or with the composite structure PNP+NPN) to be protected as well as with the protection PNP transistor in such a way that the protection PNP transistor supplies to the base node of the PNP transistor to be protected a current equal or greater than the current drawn from said node by the parasitic transistor in consequence of its turning on thus avoiding that the PNP transistor (or the composite structure PNP+NPN) to be protected be unduly turned on by the parasitic transistor.

Such a condition may also be obtained by making the protection PNP transistor of dimensions similar to those of the PNP transistor to be protected and by disposing the two pockets or regions relative to the bases of said two PNP transistors at a substantially similar distance from the emitter pocket of the parasitic transistor (typically corresponding to the collector's pocket of the real transistor subject to assume anomalously low voltage) in order that (by symmetry) the parasitic transistor draw a substantially identical current both from the base of the protection PNP transistor as well as from the node of the base of the PNP transistor to be protected and that, there fore, the protection transistor outputs, through its collector, a certain current to the node of the base of the PNP transistor to be protected at least equal or greater than that drawn by the parasitic transistor.

More advantageously though, it is preferred to suitably adjust the $\beta$ of the protection transistor (by suitably inserting a resistor of an appropriate value in the polarization network of the base) thus exploiting the multiplying effect of the gain of the protection PNP transistor for balancing the current output to the node of the base of the transistor to be protected such as to result equal or greater of that drawn by the parasitic transistor from such a node.

An advantage of that consists in the possibility of greatly reducing the dimensions of the protection PNP transistor as well as of a greater freedom in the selection of the spatial arrangement of the various pockets or regions relative to the different real transistors in the layout of the integrated circuit, in so far, within certain limits, it will be possible to adjust the $\beta$ of the protection PNP transistor in a manner suitable for obtaining a satisfactory compensation.

With the aim of making more readily understood the invention, the description shall now proceed to illustrate an example of a preferred embodiment of the invention making reference to the annexed drawings wherein:

FIG. 2 is a schematic illustration of the way a parasitic transistor interacts with the real transistors necessarily disposed one near the other in the layout, that is in the topography, of the integrated circuit of FIG. 1;

Figure 1:
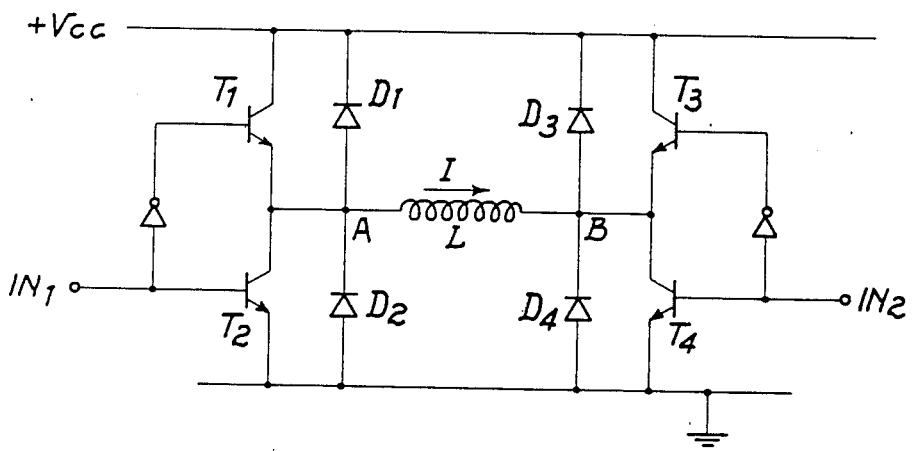

The circuit of FIG. 1 shows a typical case wherein monolithically integrated transistors $T_1$, $T_2$, $T_3$ and $T_4$ are called to drive an inductive load represented, in FIG. 1, by the external coil L connected to the pins or terminals A and B of the integrated circuit.

The way such a particular circuit of FIG. 1 operates is easily understood and may be summarized by the following level conditions of the voltage of the signals applied respectively to the $IN_1$ and $IN_2$ terminals:

| $IN_1$ = high | $T_1$ = ON  | $T_2$ = OFF |
|---------------|-------------|-------------|
| $IN_1$ = low  | $T_1$ = OFF | $T_2$ = ON  |
| $IN_2$ = high | $T_3$ = ON  | $T_4$ = OFF |
| $IN_2$ = low  | $T_3$ = OFF | $T_4$ = ON  |

Assuming to be in the particular condition $IN_1$=high and $IN_2$=low, that is with transistors $T_1$ and $T_4$ on and transistors $T_2$ and $T_3$ off, in the coil L, between the terminals A and B, there will flow a current I having the direction A→B of value determined by the voltage $V_{cc}$ and by the characteristics of the load L.

If now the condition of $IN_1$ is inverted, that is the signal applied from high becomes low, this causes the turning off of transistor $T_1$ and the turning on of transistor $T_2$, and from the initial instant of the switching till the cancellation of the current I through the coil L, the node A will bring itself to a negative voltage equal to $-V_{D2}$. This because the current through coil L, being unable to have sharp variations of intensity, will tend to maintain the same direction of flow from A→B.

Being the current unable to pass through the transistor $T_1$, being the latter off, neither, on the other hand, being able to pass through the diode $D_1$ which results reverse biased, neither through the transistor $T_2$ which is enabled to conduct in the opposite direction, the only possible path is through the diode $D_2$ which, being strapped to ground will bring the node A to the voltage of $-V_{D2}$ (−0,7 volt). Consequently also the collector of transistor $T_2$ will find itself to −0,7 volts.

In bipolar integrated circuits when a collector happens to be at −0,7 volts it excites a parasitic transistor which creates some anomalous situations in the operation of the device.

Figure 2:
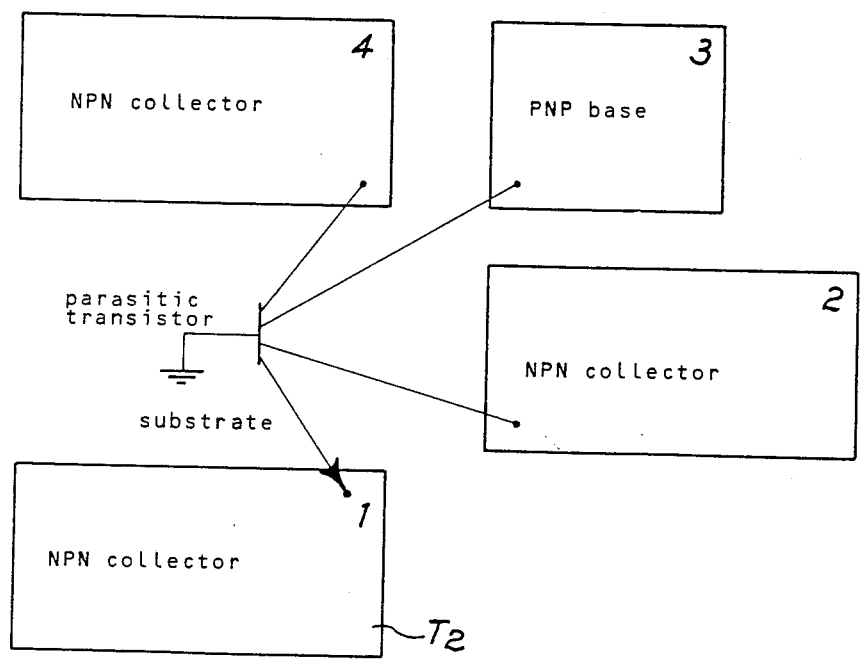
FIG. 2 is the diagram of a circuit section of a bipolar type monolithic integrated circuit which lends itself to illustrate both the technical problem to the solution of which the present invention is directed as well as the way such a problem is overcome in accordance to the invention.

The phenomenon is schematically illustrated in FIG. 2 wherein there are indicated with squares 1, 2, 3 and 4 as many pockets or regions relative to distinct transistors of the integrated circuit. When, for example, the potential of the pocket or region 1 (corresponding for example to the collector region of transistor $T_2$ of the circuit of FIG. 1) drops to −0,7 volts, the parasitic transistor, symbolically indicated in the figure, turns on and pulls current from the adjacent pockets or regions of other (real) transistors. The situation becomes very critical if nearby there is a PNP transistor connected as illustrated herein below and which is unduly turned on by the parasitic transistor.

Figure 3:
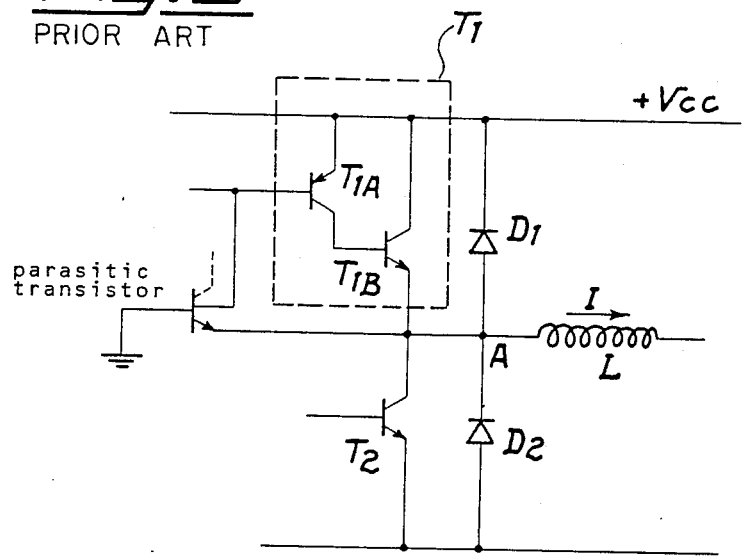
FIG. 3 is a section of the circuit diagram of FIG. 1 having brought in evidence therein a typical composite structure PNP+NPN commonly used in such integrated circuits and having the functions of the NPN transistor $T_1$ of FIG. 1, as well as the very negative and dangerous way the parasitic transistor interacts with the real PNP transistor which comes to find itself adjacent to it.

As it is well known to the expert technician, a structure normally used for implementing transistor $T_1$ of the circuit of FIG. 1 is commonly an integrated composite structure PNP+NPN formed, as shown in FIG. 3 by means of the dash line square, by a PNP transistor $T_{1A}$ and by a NPN transistor $T_{1B}$. Therefore the parasitic transistor drives the PNP transistor $T_{1A}$ which turns on the NPN transistor $T_{1B}$ thus bringing the structure $T_1$ in conduction state when the same should have remained off in accordance with the correct operation of the integrated circuit.

Such an anomalous driving by the parasitic transistor is accompanyed also by the possibility of an irreversible breakdown of the composite structure $T_1$.

Obviously, in this kind of events, are the pockets or regions closer to the one which is brought to a voltage below ground, that is, in the specific example, the collector of transistor $T_2$, to be more affected by the parasitic transistor. On the other hand it is often impossible to sufficiently space the regions belonging to the different transistors in the layout of the circuit in order to prevent or reduce the effects consequential of the excitation of the parasitic transistor because of obvious integration requirements.

Figure 4:
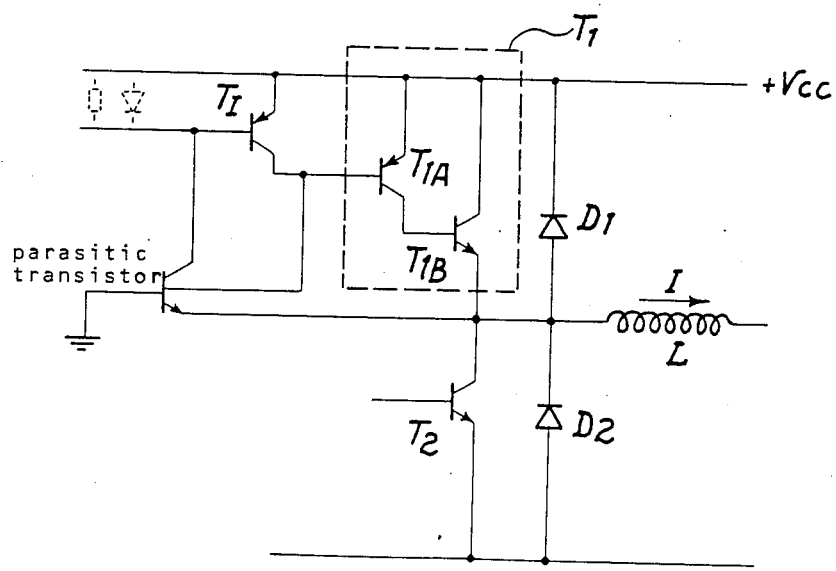
FIG. 4 is the same section of the circuit diagram of the preceding FIG. 3 modified according to the present invention.

The protection device object of the present invention is schematically illustrated in FIG. 4 which shows the same section of the circuit diagram of the preceding FIG. 3 modified in accordance with the present invention.

A protection PNP transistor $T_I$ is located, in the layout of the integrated circuit, immediately near the pocket or region of the collector of transistor $T_2$, referably in a way as to result closer to this latter pocket than to the transistor $T_{1A}$.

The protection PNP transistor $T_I$ has its collector connected to the node of the base of the PNP transistor to be protected $T_{1A}$, its emitter connected to the node of the emitter of said transistor $T_{1A}$ (though the emitter of $T_I$, as already said before, may be connected in the alternative to a node at a voltage greater than the voltage of the emitter of $T_{1A}$) and the base connected to a control biasing network which is normally made by connecting a diode or, preferably, a resistor of suitable value between the base and the emitter of said protection transistor $T_I$.

Assuming, for example, that the protection transistor $T_I$ has been so designed such that the area of its base pocket corresponds more or less to half of the area of the base pocket of the transistor to be protected $T_{1A}$ and that said two pockets are located more or less at the same distance from the collector's pocket of transistor $T_2$, under these conditions, the parasitic transistor, excited by the falling of the voltage of the node A (that is of the collector of transistor $T_2$) below the ground potential, has a similar action respectively on the bases of the protection transistor $T_I$ and of the transistor to be protected $T_{1A}$.

In other words, if the parasitic transistor draws, for example, 50 μA from the node 1, it will draw about 100 μA from the node 2 (base's pocket of $T_{1A}$ having double size in comparison to the base's pocket of $T_I$).

However, simultaneously, the protection transistor $T_I$ shall output to the node 2 a current equal to $\beta \times 50$ μA and, summing the currents at node 2, the transistor to be protected $T_{1A}$ will have on its base a current equal to $\beta \times 50\text{-}100 \ \mu A$.

Therefore, having taken care in the design stage, to adjust the $\beta$ of the protection transistor $T_I$ such as to be about equal to 2 by inserting a resistor of suitable value in the biasing network of the base, the current output to node 2 by the protection transistor will be equal to 100 uA and consequently transistor $T_{1A}$ will be maintained off thus preventing its anomalous turning on.

Though the invention has been described to a specific application thereof particularly preferred, it is applicable successfully in different types of circuits, as it will be evident to the expert technician, though remaining within the scope of the invention.

What we claim is:

1. A protection device against the driving effect of a parasitic transistor upon an adjacent PNP transistor in the layout of a bipolar type monolithic integrated circuit comprising a protection PNP transistor having an emitter, a base and a collector, the collector being connected to a base of said adjacent PNP transistor to be protected, the emitter being connected to a circuit node at a voltage equal to or greater than an emitter voltage of said adjacent PNP transistor to be protected; said protection PNP transistor being realized in said integrated circuit in a position substantially adjacent to said adjacent PNP transistor to be protected, the parasitic transistor pulling current from respective base pockets of both PNP transistors and the PNP protection transistor supplying a counterbalancing current to the base pocket of the adjacent PNP transistor to be protected.

2. The device of claim 1 wherein the base of said protection PNP transistor is left disconnected.

3. The device of claim 1 wherein the base of said protection PNP transistor is connected to a network for adjusting the current gain ($\beta$) of the protection PNP transistors.

4. The device of claim 3 wherein said protection PNP transistor has substantially the same dimensions as said adjacent PNP transistor to be protected, respective base's pockets of the two PNP transistors being substantially at the same distance from an emitter's pocket of said parasitic transistor, and the ($\beta$) current gain of said protection transistor being substantially equal to unity.

5. The device of claim 1 wherein said protection PNP transistor has smaller dimensions that those of said adjacent PNP transistor to be protected and a $\beta$ current gain greater than unity.

* * * * *